(12) United States Patent
Takei

(10) Patent No.: US 8,680,859 B2
(45) Date of Patent: Mar. 25, 2014

(54) MAGNETIC RESONANCE IMAGING APPARATUS AND METHOD

(75) Inventor: Naoyuki Takei, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 475 days.

(21) Appl. No.: 12/893,960

(22) Filed: Sep. 29, 2010

(65) Prior Publication Data

US 2011/0074412 A1  Mar. 31, 2011

(30) Foreign Application Priority Data

Sep. 30, 2009  (JP) .................................. 2009-226822

(51) Int. Cl.
*G01V 3/00* (2006.01)

(52) U.S. Cl.
USPC .......................................... 324/309; 324/307

(58) Field of Classification Search
USPC .................... 324/309, 307; 600/410, 420
See application file for complete search history.

(56) References Cited

U.S. PATENT DOCUMENTS 5,243,284 A *  9/1993  Noll ............................. 324/309
5,297,033 A     3/1994  Bito et al.
8,135,452 B2 *  3/2012  Dougherty et al. ........... 600/420
2009/0082656 A1 *  3/2009  Bayram et al. ................. 600/410
2009/0182222 A1   7/2009  Machida et al.

FOREIGN PATENT DOCUMENTS

| JP | 04-075637 | 3/1992 |
| JP | 04-117944 | 4/1992 |
| JP | 06-327649 | 11/1994 |
| JP | 2003-000564 | 1/2003 |
| JP | 2009-183685 | 8/2009 |

* cited by examiner

*Primary Examiner* — Louis Arana
(74) *Attorney, Agent, or Firm* — Armstrong Teasdale LLP

(57) ABSTRACT

A magnetic resonance imaging apparatus includes z segments which divide a ky-kz plane. The z segments includes data located therein. The ky-kz plane is divided into z center-in regions and z center-out regions by a plurality of lines extending radially from a center of the ky-kz plane. The z center-in regions have data located therein in accordance with first trajectories which proceed toward the center of the ky-kz plane. The z center-out regions have data located therein in accordance with second trajectories which proceed in a direction spaced away from the center of the ky-kz plane. Each of the z segments has one center-in region of the z center-in regions and one center-out region of the z center-out regions. Each of the z segments is defined in which after data have been located in said one center-in region in accordance with the first trajectory, data are located in said one center-out region in accordance with the second trajectory. At least one of the z segments is defined in which an angle of said one center-in region at the center of the ky-kz plane is wider than an angle of said one center-out region at the center of the ky-kz plane.

20 Claims, 21 Drawing Sheets

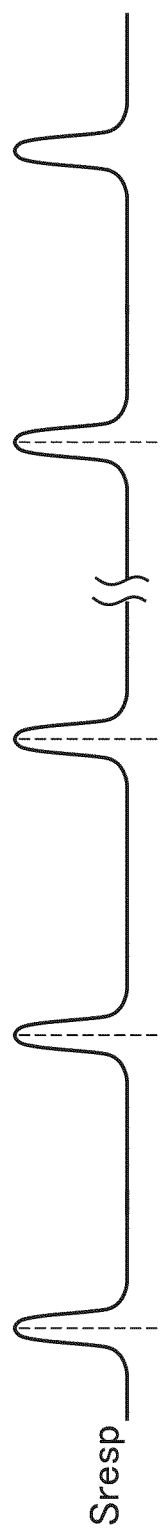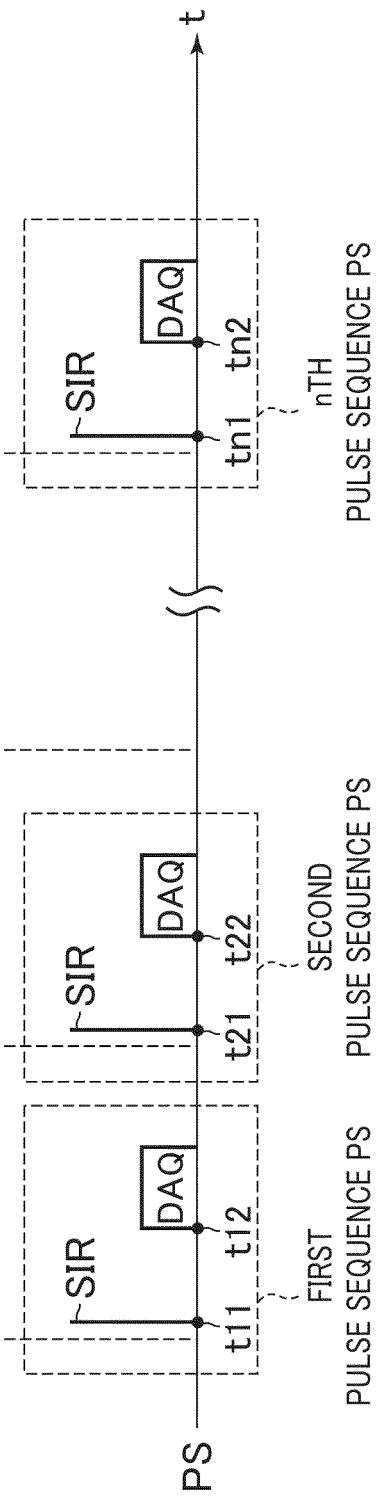
FIG. 5A
FIG. 5B

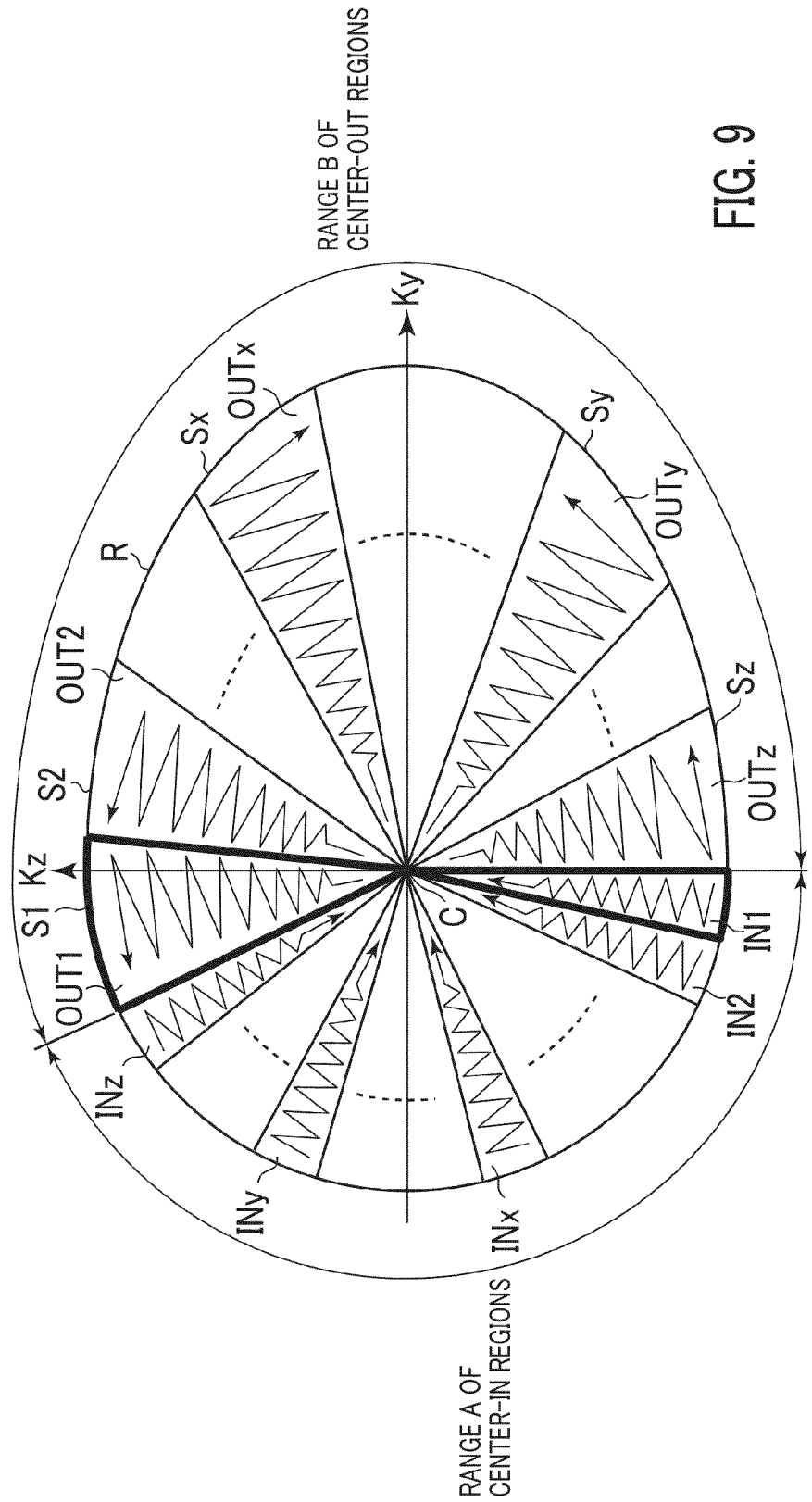

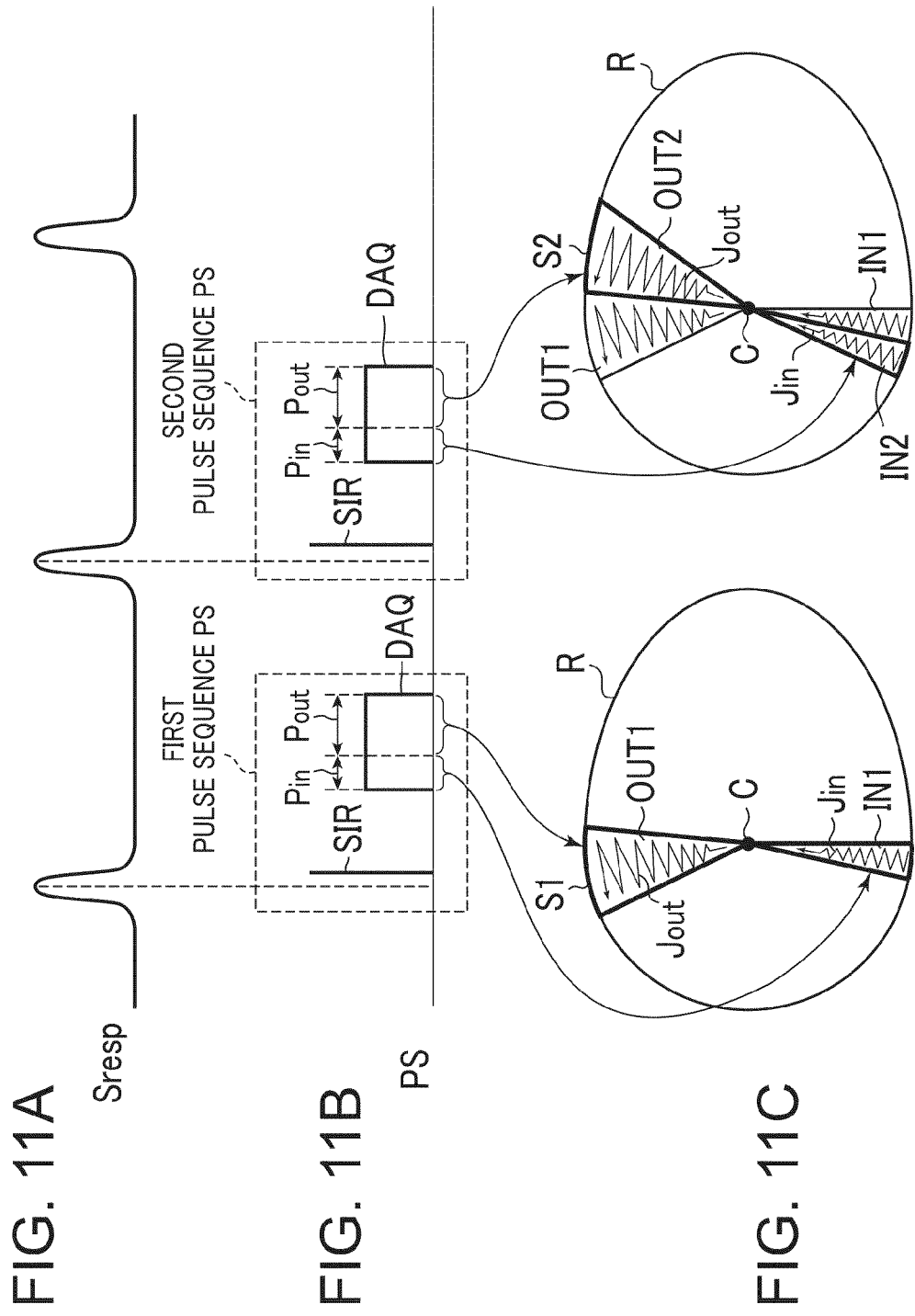

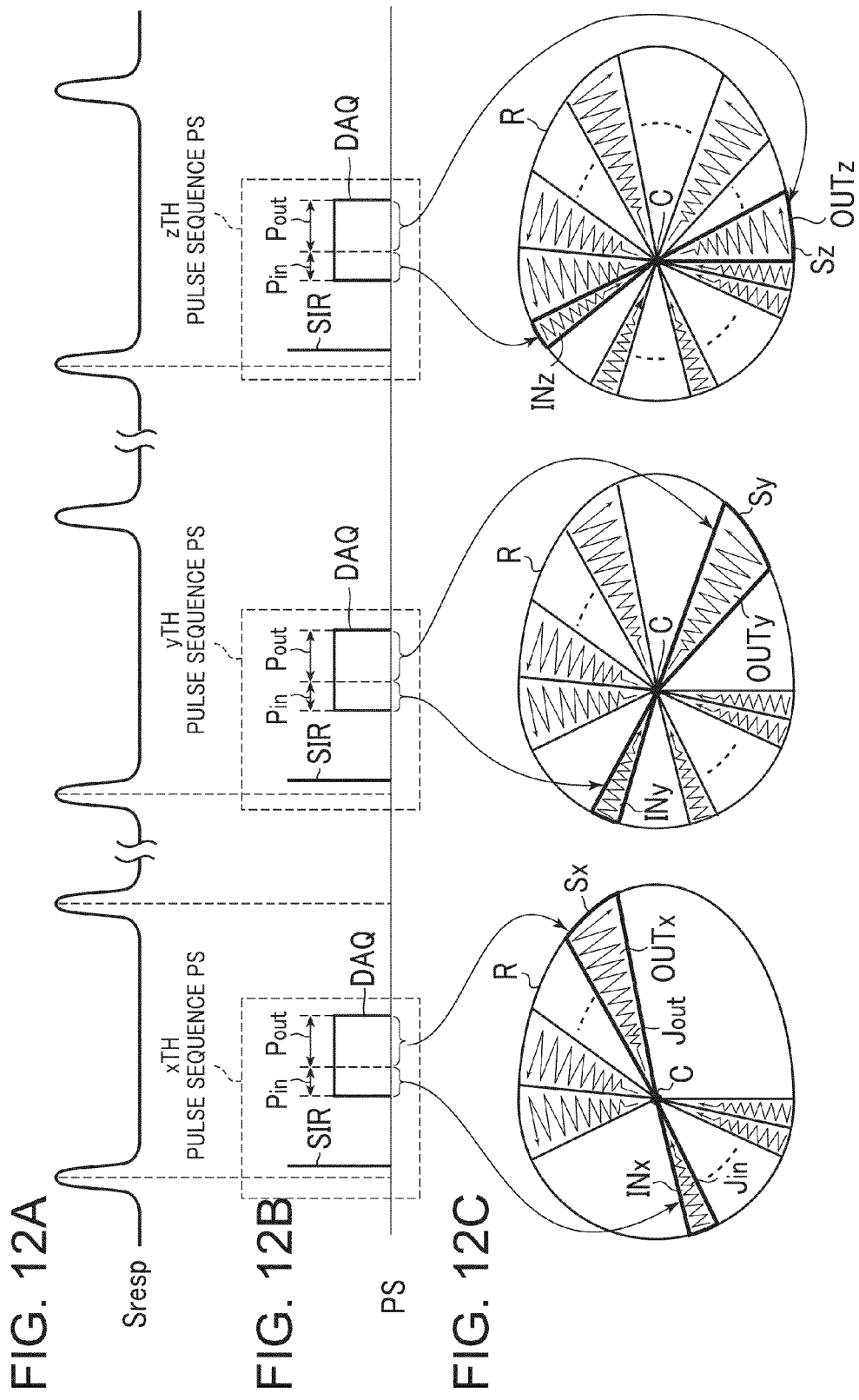

FIG. 20A  FIG. 20B  FIG. 20C  FIG. 20D

| | 32 (FIG. 16) | 21 (FIG. 17) | 16 (FIG. 18) | |
|---|---|---|---|---|
| NUMBER OF SEGMENTS Z | 32 (FIG. 16) | 21 (FIG. 17) | 16 (FIG. 18) | |
| NUMBER OF DATA POINTS CONTAINED IN ONE CENTER-IN REGION | 30 | 30 | 30 | IMAGED BY ORTHOGONAL VIEW ORDERING |
| NUMBER OF DATA POINTS CONTAINED IN ONE CENTER-OUT REGION | 50 | 90 | 120 | |
| LENGTH OF DATA ACQUISITION SEQUENCE DAQ | 400ms | 600ms | 800ms | 432ms |
| IMAGING TIME | 2' 17" | 1' 30" | 1' 09" | 2' 17" |

MAGNETIC RESONANCE IMAGING APPARATUS AND METHOD

CROSS REFERENCE TO RELATED APPLICATIONS

This application claims the benefit of Japanese Patent Application No. 2009-226822 filed Sep. 30, 2009, which is hereby incorporated by reference in its entirety.

BACKGROUND OF THE INVENTION

The present invention relates to a magnetic resonance imaging apparatus that acquires magnetic resonance signals from a subject.

As a method for filling data into a (ky, kz) plane in a k-space by three-dimensional imaging, there is known a method using orthogonal view ordering (refer to Japanese Unexamined Patent Publication No. 2009-183685).

In the orthogonal view ordering, the (ky, kz) plane is divided into segments every line orthogonal to a kz axis and data are acquired. Accordingly, a problem arises in that the greater the number of segments, the longer the imaging time. As a method for shortening the imaging time, there is considered one wherein two lines orthogonal to a kz axis are contained in one segment. This method is however accompanied by a problem in that the contrast of an image is reduced.

It desirable that the problems described previously are solved.

BRIEF DESCRIPTION OF THE INVENTION

An aspect of the invention is of a magnetic resonance imaging apparatus including: z segments which divide a ky-kz plane and include data located therein, wherein the ky-kz plane is divided into z center-in regions and z center-out regions by a plurality of lines extending radially from a center of the ky-kz plane, wherein the z center-in regions have data located therein in accordance with first trajectories which proceed toward the center of the ky-kz plane, wherein the z center-out regions have data located therein in accordance with second trajectories which proceed in a direction spaced away from the center of the ky-kz plane, wherein each of the z segments has one center-in region of the z center-in regions and one center-out region of the z center-out regions, wherein each of the z segments is defined in which after data have been located in the one center-in region in accordance with the first trajectory, data are located in the one center-out region in accordance with the second trajectory, and wherein at least one of the z segments is defined in which an angle of the one center-in region at the center of the ky-kz plane is wider than an angle of the one center-out region at the center of the ky-kz plane.

In the invention, the angle of each center-out region at the center of a ky-kz plane is wider than the angle of each center-in region at the center of the ky-kz plane. Thus, since the number of data located in one segment can be increased, the total number of segments can be reduced and the imaging time can hence be shortened.

Since the timings taken when data are located in the neighborhood of the center of the ky-kz plane can be adjusted by adjusting the number of data contained in the center-in and center-out regions, high-contrast images can be obtained.

Further objects and advantages of the present invention will be apparent from the following description of the preferred embodiments of the invention as illustrated in the accompanying drawings.

BRIEF DESCRIPTION OF THE DRAWINGS

FIGS. 5A and 5B are diagrams showing a relationship between a respiratory waveform of a subject 12 and a pulse sequence PS.

FIG. 9 is a diagram illustrating z segments defined in the data location region R.

FIGS. 11A, 11B, and 11C are explanatory diagrams used when data are located in a data location region R.

FIGS. 12A, 12B, and 12C are diagrams showing the manner in which data are located in the segments Sx, Sy and Sz.

FIGS. 20A through 20D are diagrams for describing imaged results.

DETAILED DESCRIPTION OF THE INVENTION

Figure 1:
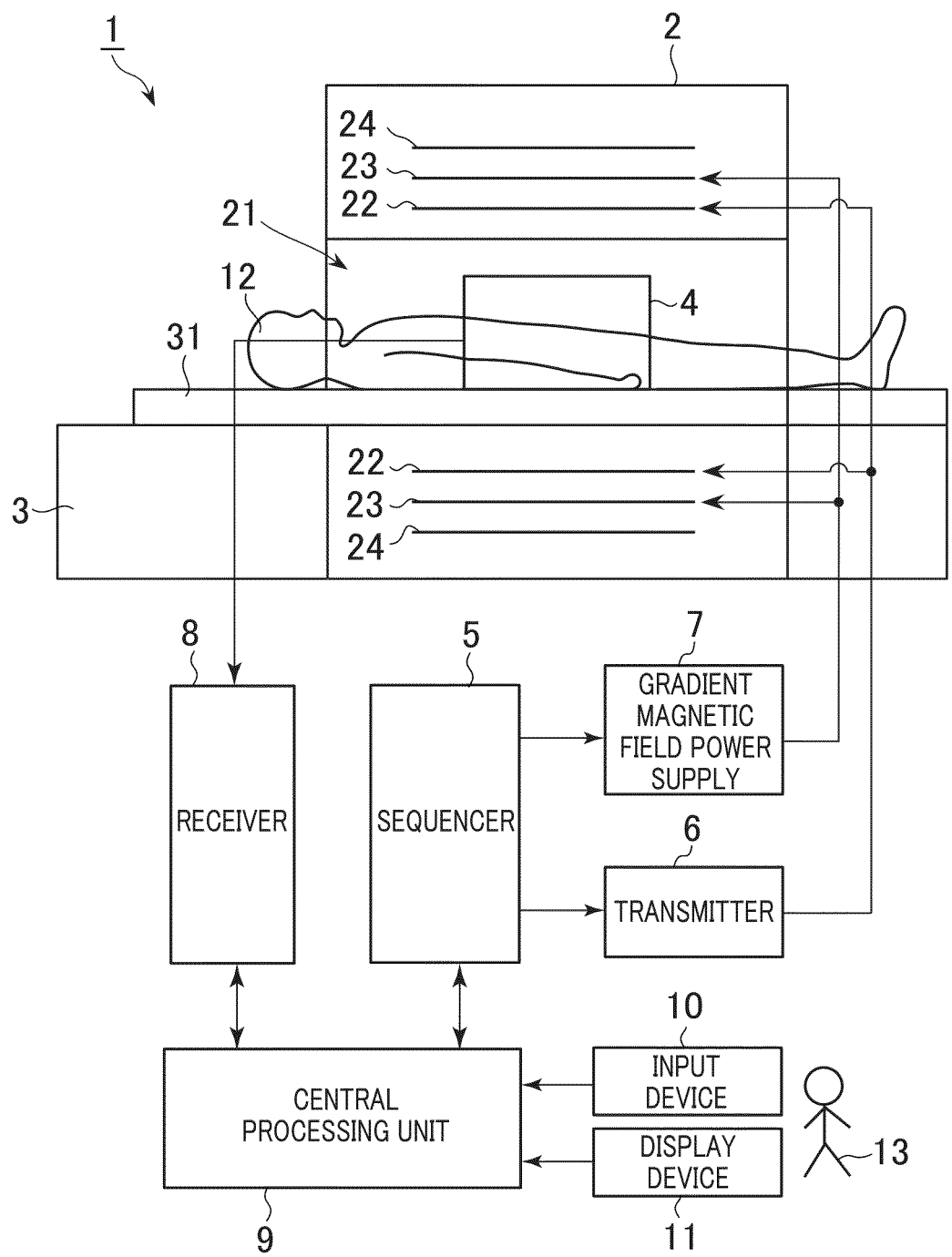
FIG. 1 is a schematic diagram of a magnetic resonance imaging apparatus according to a first embodiment of the invention.

FIG. 1 is a schematic diagram of a magnetic resonance imaging apparatus according to a first embodiment of the invention.

The magnetic resonance imaging apparatus (hereinafter called "MRI (Magnetic Resonance Imaging) apparatus") 1 has a magnetic field generator 2, a table 3, a receiving coil 4, etc.

The magnetic field generator 2 has a bore 21 in which a subject 12 is accommodated, a superconductive coil 22, a gradient coil 23 and a transmitting coil 24. The superconductive coil 22 applies a static magnetic field B0, the gradient coil 23 applies a gradient pulse and the transmitting coil 24 transmits an RF pulse.

The table 3 has a cradle 31 for conveying the subject 12. The subject 12 is conveyed to the bore 21 by the cradle 31.

The receiving coil 4 is attached to the abdominal part 12a of the subject 12 and receives a magnetic resonance signal from the abdominal part 12a.

The MRI apparatus 1 further has a sequencer 5, a transmitter 6, a gradient magnetic field power supply 7, a receiver 8, a central processing unit 9, an input device 10 and a display device 11.

The sequencer 5 transmits information about an RF pulse (center frequency, band width, etc.) to the transmitter 6 under control of the central processing unit 9 and sends information (intensity of gradient magnetic field or the like) about a gradient magnetic field to the gradient magnetic field power supply 7.

The transmitter 6 drives the transmitting coil 24 based on the information sent from the sequencer 5.

The gradient magnetic field power supply 7 drives the gradient coil 23 based on the information sent from the sequencer 5.

The receiver 8 signal-processes the magnetic resonance signal received by the receiving coil 4 and transmits the so-processed signal to the central processing unit 9.

The central processing unit 9 transmits information about a pulse sequence PS for dividing a ky-kz plane to a plurality of segments S1 through Sz (refer to FIG. 9, for example) and thereby acquiring data to the sequencer 5 in such a manner that the pulse sequence PS is executed. The central processing unit 9 also transmits information about a navigator sequence for acquiring navigator echoes to the sequencer 5 to image the subject 12 by a respiratory gating method. Further, the central processing unit 9 generally performs operations of respective parts of the MRI apparatus 1 so as to realize various operations of the MRI apparatus 1 such as reconstruction of an image based on the signal received from the receiver 8, etc. The central processing unit 9 is configured by a computer, for example.

The input device 10 inputs various instructions to the central processing unit 9 in accordance with the operation of an operator 13.

The display device 11 displays various information thereon.

The subject 12 is imaged using the MRI apparatus 1 configured in the above-described manner.

Figure 2:
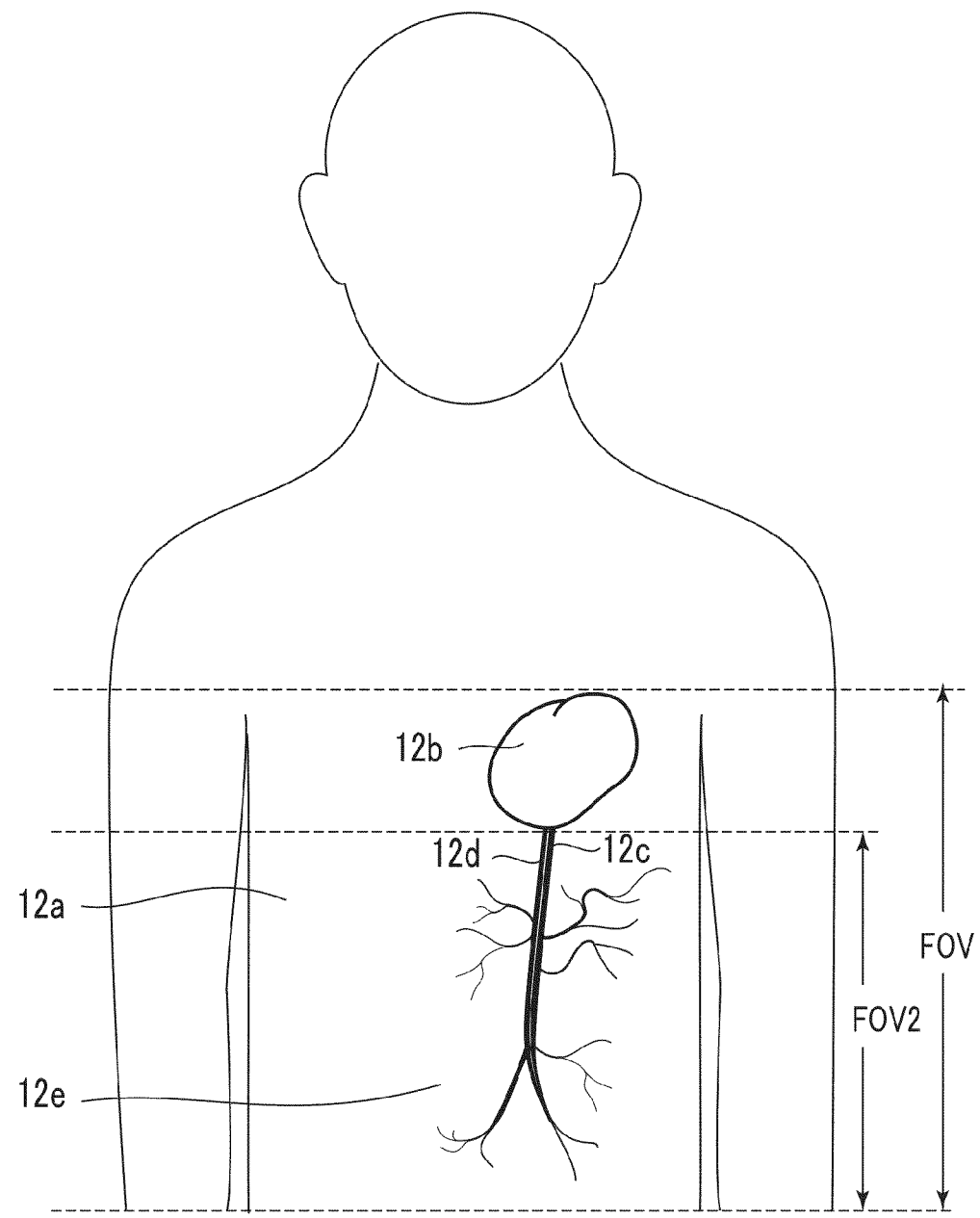
FIG. 2 is a diagram showing a region to be imaged in the present embodiment.
Figure 3:
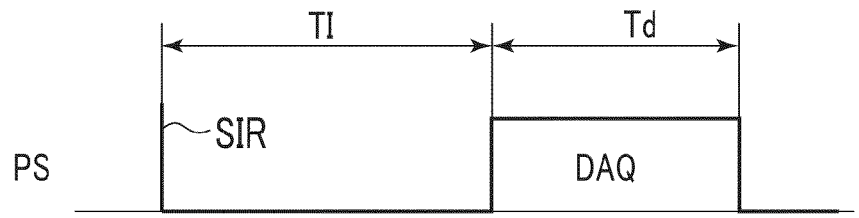
FIG. 3 is a diagram illustrating a pulse sequence used when the imaging region is imaged.

FIG. 2 is a diagram showing a region or portion to be imaged in the present embodiment, and FIG. 3 is a diagram showing a pulse sequence used when the imaging region is imaged.

In the present embodiment, a field of view FOV includes the abdominal part 12a of the subject 12.

The pulse sequence PS is of a pulse sequence for inhibiting background tissues (e.g., venous blood 12d and muscle 12e) of the abdominal part 12a and emphatically visualizing or representing arterial blood 12c. The pulse sequence PS has a selective inversion pulse SIR (Selective Inversion Recovery) and a data acquisition sequence DAQ.

The selective inversion pulse SIR is of a pulse for inverting longitudinal magnetization of a tissue in a lower region FOV2 located on the lower side of the heart 12b within the field of view FOV (refer to FIG. 2) of the subject 12. An inversion time TI of the selective inversion pulse SIR is set to the time taken for longitudinal magnetization of the venous blood 12d to reach a null point. The inversion time TI is a value of about 1 (sec) to about 1.5 (sec), for example.

The data acquisition sequence DAQ is of a sequence for acquiring data located in a k-space in accordance with z segments. The data acquisition sequence DAQ can make use of a sequence of a gradient echo method and a sequence of a spin echo method. A time length Td of the data acquisition sequence DAQ ranges from about 400 ms to about 1500 ms, for example.

A description will next be made of how longitudinal magnetization of each tissue in a field of view FOV changes where the field of view FOV is imaged in accordance with the pulse sequence PS.

Figure 4:
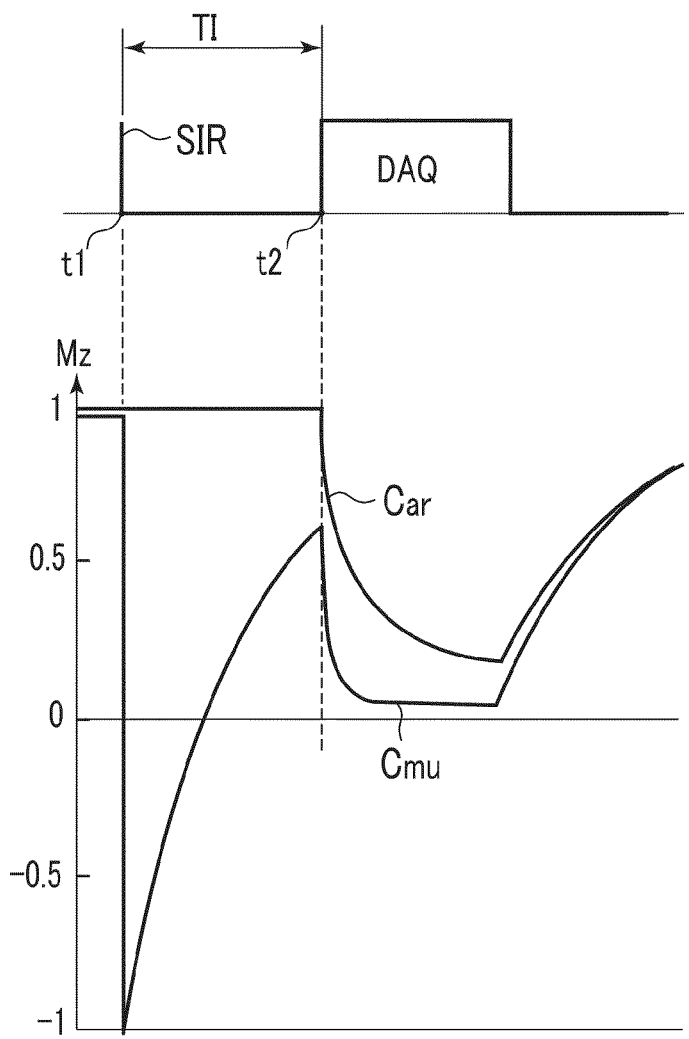
FIG. 4 is a diagram depicting a pulse sequence PS and a graph showing changes in longitudinal magnetization of tissues in a field of view FOV.

FIG. 4 is a diagram showing a pulse sequence PS and a graph indicative of changes in the longitudinal magnetization of the tissues in the field of view FOV.

Two longitudinal magnetization curves are shown in the graph. The longitudinal magnetization curve Car represents a time change in longitudinal magnetization of the arterial blood 12c that flows from the heart 12b to the lower region FOV2. The longitudinal magnetization curve Cmu represents a time change in longitudinal magnetization of the muscle 12e in the lower region FOV2.

The arterial blood 12c does not yet flow into the lower region FOV2 at a transmission time t1 of the selective inversion pulse SIR and is assumed to exist in the heart 12b. Thus, the longitudinal magnetization Mz of the arterial blood 12c is Mz=1 at the transmission time of the selective inversion pulse SIR. Since the arterial blood 12c from the heart 12b flows into the lower region FOV2 during the inversion time T1, the arterial blood 12c of the longitudinal magnetization Mz=1 reaches throughout the entire field of view FOV until a start time t2 of the data acquisition sequence DAQ.

On the other hand, the longitudinal magnetization of the muscle 12e in the lower region FOV2 is inverted from Mz=1 to Mz=−1 by the selective inversion pulse SIR at the transmission time t1 of the selective inversion pulse SIR. The recovery of the longitudinal magnetization of the muscle 12e proceeds during the inversion time TI. Hence the longitudinal magnetization thereof is recovered to Mz=about 0.6 until the start time t2 of the data acquisition sequence DAQ. When the data acquisition sequence DAQ is executed, data are acquired from the field of view FOV. While the data acquisition sequence DAQ is being executed, the longitudinal magnetization Mz of the arterial blood 12c and that of the muscle 12e decrease gradually. Since, however, the longitudinal magnetization Mz of the arterial blood 12c is sufficiently larger than the longitudinal magnetization Mz of the muscle 12e, the arterial blood 12c can be visualized with more emphatic than the muscle 12e. The inversion time TI is of a value set in such a manner that the longitudinal magnetization Mz of the venous blood 12d is set to reach Mz=0 at the start time t2 of the data acquisition sequence DAQ. Thus, the arterial blood 12c can also be visualized with more emphatic than the venous blood 12d.

Incidentally, since the field of view FOV includes the abdominal part, it is displaced depending on the respiration. Thus, when data are acquired where body motion based on the respiration is large, a high-quality image cannot be obtained due to motion artifacts by the respiration. Therefore, in the present embodiment, the subject 12 is imaged or captured by the respiratory gating method.

FIGS. 5A and 5B are diagrams showing a relationship between a respiratory waveform of the subject 12 and a pulse sequence PS.

The pulse sequence PS is repeatedly executed in sync with the peak of the respiratory waveform Sresp. It is thus possible to execute the pulse sequence PS while the body motion based on the respiration is being set small. Repeatedly executing the pulse sequence PS enables acquisition of the data located in the k-space.

A description will next be made of how the data are located or disposed in the k-space in the first embodiment. Since the k-space is divided into the segments in the first embodiment, a description will first be made of how the k-space is divided.

FIGS. 6 through 10 are diagrams for describing how the k-space is divided into segments in the first embodiment.

Figure 6:
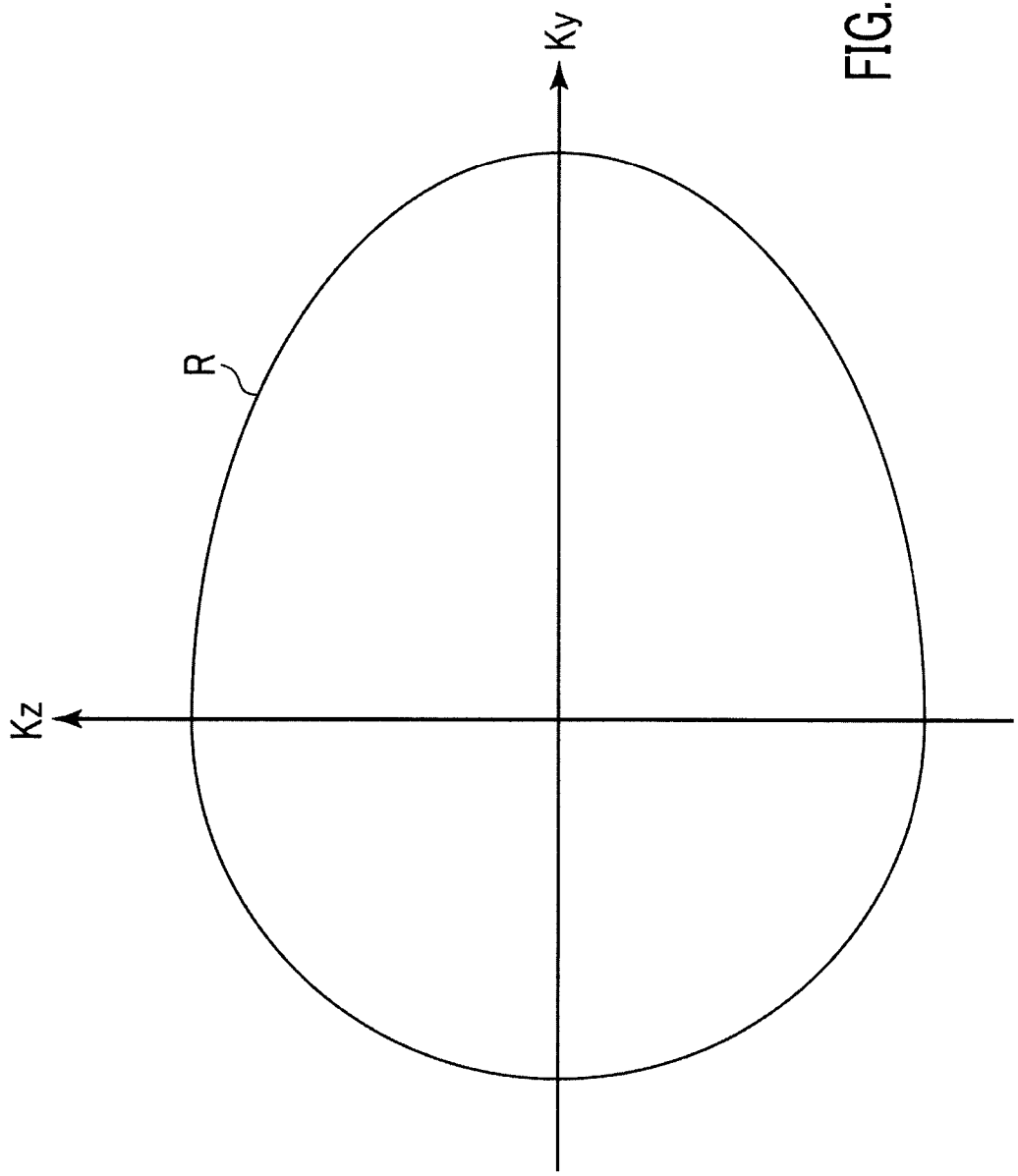
FIG. 6 is a diagram illustrating a region in which data are located in a k-space.

FIG. 6 is a diagram showing a region in which data are located in the k-space.

A ky-kz plane of the k-space is shown in FIG. 6 for convenience of explanation. In the first embodiment, the shape of a data layout or location region R is not rectangular but approximately elliptical. The data location region R is further divided into two regions R1 and R2.

Figure 7:
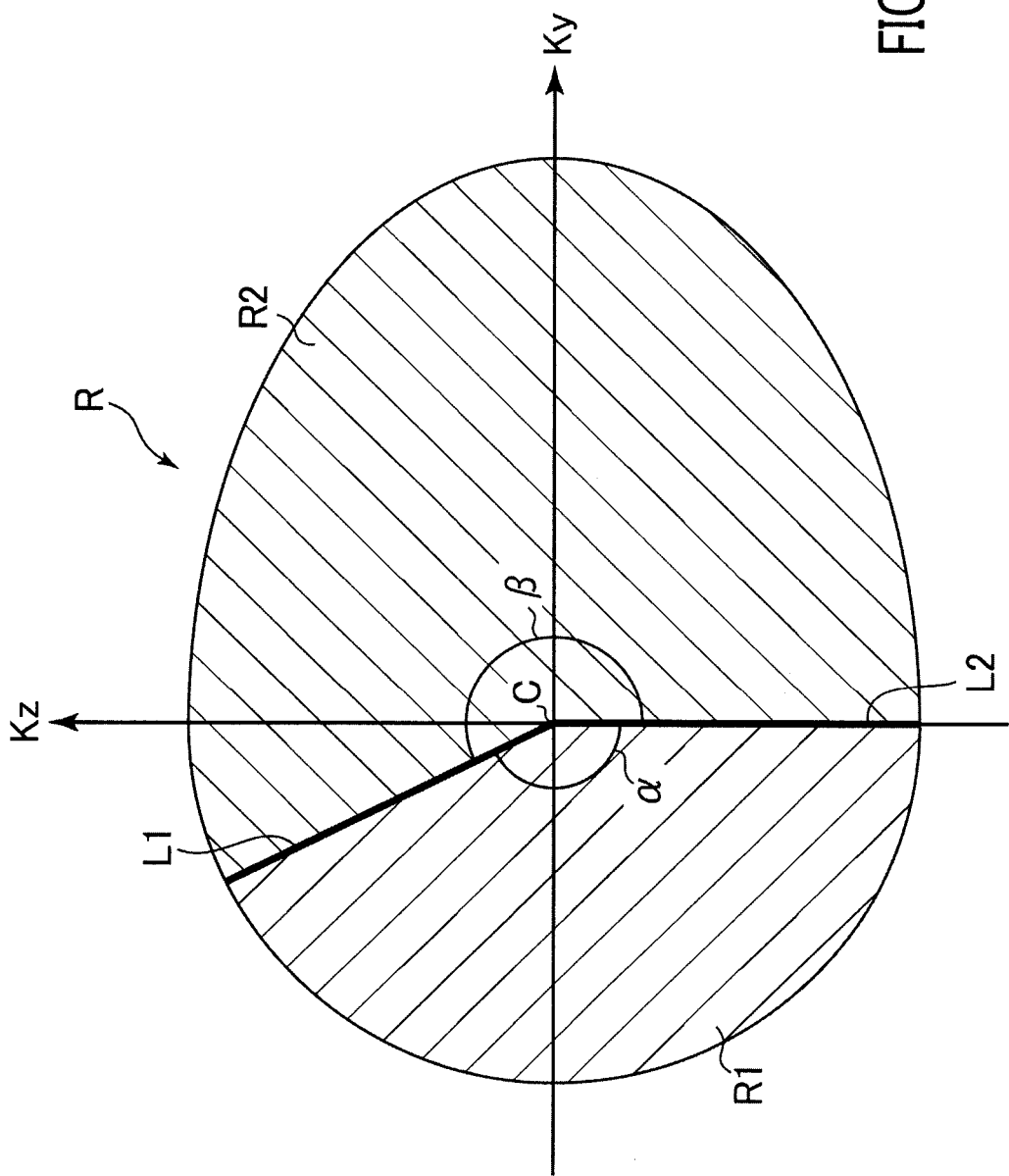
FIG. 7 is a diagram showing the manner in which a data location region R is divided into two regions R1 and R2.

FIG. 7 is a diagram showing the manner in which the data location region R is divided into the two regions R1 and R2.

The data location region R is divided into the two regions R1 and R2 by two lines L1 and L2 extending from the center C of the ky-kz plane. An angle β of the region R2 at the center C of the ky-kz plane has an angle wider than an angle α of the region R1 at the center C of the ky-kz plane. Further, the two regions R1 and R2 are respectively divided into z regions.

Figure 8:
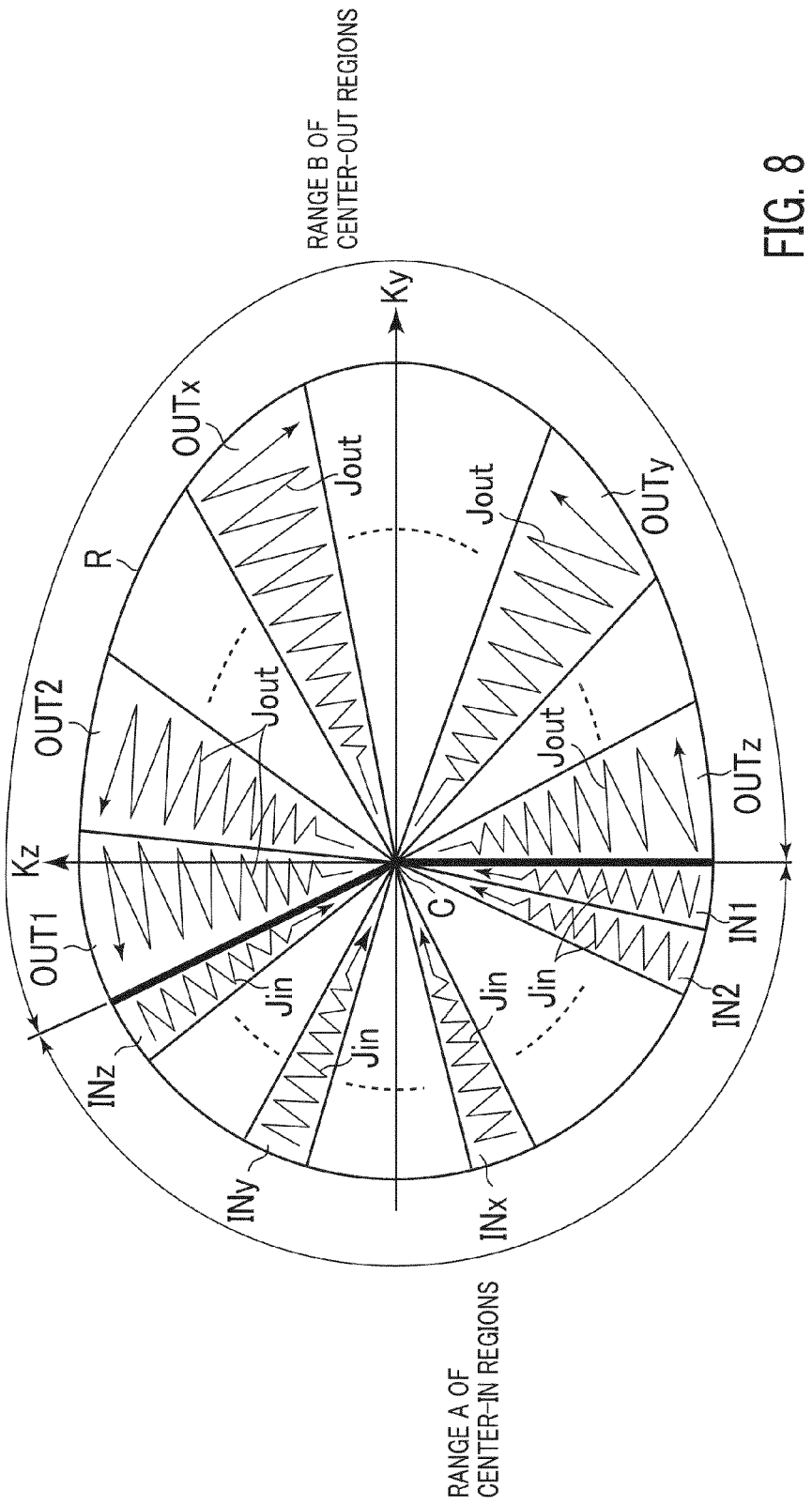
FIG. 8 is a diagram showing the manner in which the two regions R1 and R2 are respectively divided into z regions.
Figure 10E:
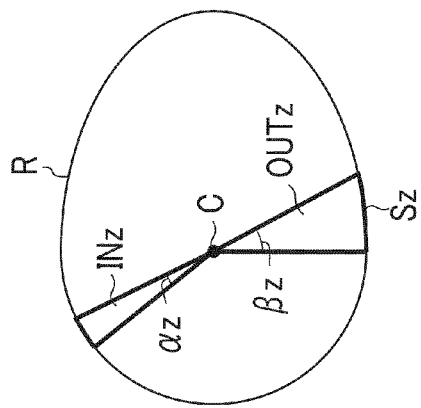
FIGS. 10A through 10E are diagrams individually showing five segments S1, S2, Sx, Sy and Sz of z segments S1 through Sz.
Figure 10B:
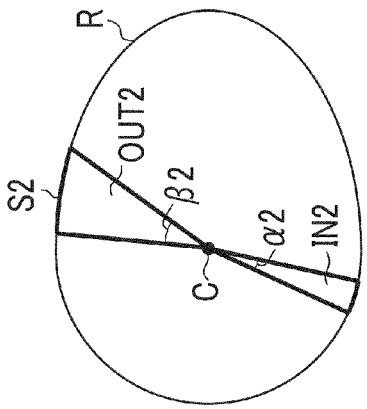
Figure 10D:
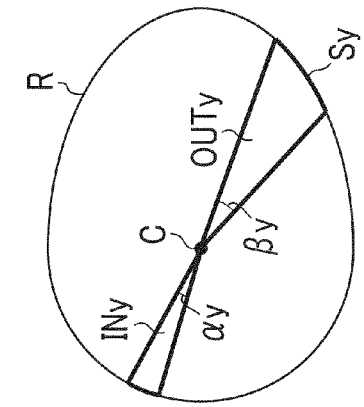
Figure 10A:
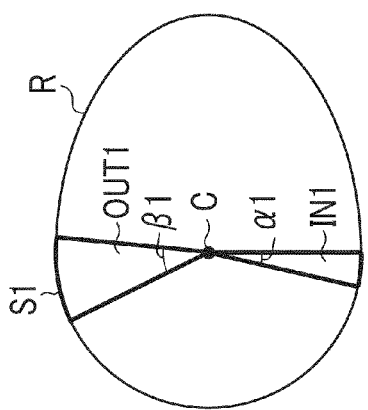
Figure 10C:
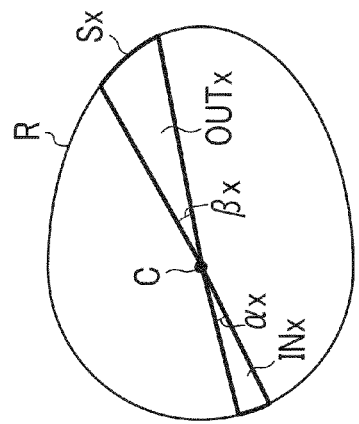

FIG. 8 is a diagram showing the manner in which each of the two regions R1 and R2 is divided into the z regions.

The region R1 is divided into z center-in regions IN1 through INz with the center C of the ky-kz plane as the reference. The center-in regions IN1 through INz are regions in which data are respectively located or laid out in accordance with first trajectories Jin that proceed in zigzags toward the center C of the ky-kz plane.

The region R2 is divided into z center-out regions OUT1 through OUTz with the center C of the ky-kz plane as the reference. The center-out regions OUT1 through OUTz are regions in which data are respectively located in accordance with second trajectories Jout that proceed in zigzags in the direction spaced away from the center C of the ky-kz plane.

By combining one center-in region INj (where j=integers from 1 to z) of the z center-in regions IN1 through INz and one center-out region OUTj (where j=integers from 1 to z) of the z center-out regions OUT1 through OUTz, one segment is defined in the data location region R. Since the z center-in regions IN1 through INz and the z center-out regions OUT1 through OUTz exist in FIG. 8, z segments are defined in the data location region R. The z segments defined in the data location region R will next be explained.

FIG. 9 is a diagram showing the z segments defined in the data location region R.

The z segments S1 through Sz are defined in the data location region R. The segments Sj (where j=integers from 1 to z) are defined by combinations of the center-in regions INj and the center-out regions OUTj. In FIG. 9, a region for the segment S1 of the z segments S1 through Sz is indicated by a heavy line.

FIGS. 10A through 10E are diagrams individually showing five segments S1, S2, Sx, Sy and Sz of z segments S1 through Sz.

The segment S1 (refer to FIG. 10A) is defined in such a manner that the following relation is established between a vertical angle α1 of the center-in region IN1 and a vertical angle β1 of the center-out region OUT1:

$$\alpha 1 < \beta 1 \qquad (1)$$

Namely, the vertical angle β1 of the center-out region OUT1 is set so as to assume a value larger than the vertical angle α1 of the center-in region IN1. This reason will be described later. While the above has explained the relationship between the vertical angle α1 of the center-in region IN1 of the segment S1 and the vertical angle β1 of the center-out region OUT1 thereof, the relationships between the vertical angles of the center-in regions of other segments and the vertical angles of the center-out regions thereof are also similar to the above. In the segment S2, for example, the numeral "1" in the expression (1) may be replaced with "2". Thus, if the expression (1) is generalized, it is represented by the following expression:

$$\alpha j < \beta j \qquad (2)$$

where j=integers of 1 to z.

The segments S1 through Sz are defined in such a manner that the expression (2) is established. A description will next be made of how data are located in the data location region R divided into the segments S1 through Sz.

FIG. 11 is an explanatory diagram used when data are located in the data location region R.

FIG. 11A is a diagram showing a respiratory signal, FIG. 11B is a diagram showing a pulse sequence PS, and FIG. 11C is a diagram showing a data location region R of a ky-kz plane, respectively.

In a first pulse sequence PS, data located in the corresponding segment S1 are acquired. A data acquisition sequence DAQ is divided into a center-in period Pin and a center-out period Pout. During the center-in period Pin, data located in the center-in region IN1 of the segment S1 are acquired. On the other hand, during the center-out period Pout, data located in the corresponding center-out region OUT1 of the segment S1 are acquired. Data are located in the center-in region IN1 in accordance with a trajectory Jin that proceeds in zigzags toward the center C of the ky-kz plane. Data are located in the center-out region OUT1 in accordance with a trajectory Jout that proceeds in zigzags in the direction spaced away from the center C of the ky-kz plane.

After the data have been located in the segment S1, a second pulse sequence PS is executed.

In the second pulse sequence PS, data located in the corresponding segment S2 are acquired. A data acquisition sequence DAQ is divided into a center-in period Pin and a center-out period Pout. During the center-in period Pin, data located in the center-in region IN2 of the segment S2 are acquired. On the other hand, during the center-out period Pout, data located in the corresponding center-out region OUT2 of the segment S2 are acquired. Data are located in the center-in region IN2 in accordance with a trajectory Jin that proceeds in zigzags toward the center C of the ky-kz plane. Data are located in the center-out region OUT2 in accordance with a trajectory that proceeds in zigzags in the direction spaced away from the center C of the ky-kz plane.

Data located in the remaining segments S3 through Sz are sequentially acquired in like manner subsequently.

FIGS. 12A through 12C are diagrams showing the manner in which data are located in their corresponding segments Sx, Sy and Sz.

FIG. 12A is a diagram showing a respiratory signal, FIG. 12B is a diagram showing a pulse sequence PS, and FIG. 12C is a diagram showing a data location region R of a ky-kz plane, respectively.

In an xth pulse sequence PS, data located in the segment Sx are acquired. A data acquisition sequence DAQ is divided into a center-in period Pin and a center-out period Pout. During the center-in period Pin, data located in the corresponding center-in region INx of the segment Sx are acquired. On the other hand, during the center-out period Pout, data located in the corresponding center-out region OUTx of the segment Sx are acquired. Data are located in the center-in region INx in accordance with a trajectory Jin that proceeds in zigzags toward the center C of the ky-kz plane. Data are located in the center-out region OUTx in accordance with a trajectory Jout that proceeds in zigzags in the direction spaced away from the center C of the ky-kz plane.

Data are located even in the segments Sy and Sz in like manner subsequently. The data are located in the entire data location region R by locating the data in the segment Sz.

Locating the data in the data location region R in accordance with the method described with reference to FIGS. 11A-11C and 12A-12C makes it possible to inhibit each background tissue in the field of view FOV (refer to FIG. 2) and obtain a high-contrast image visualized by emphasizing the arterial blood 12c. This reason will be explained below. Incidentally, the following description will be made taking up the muscle 12e as the background tissue for convenience.

Figure 13:
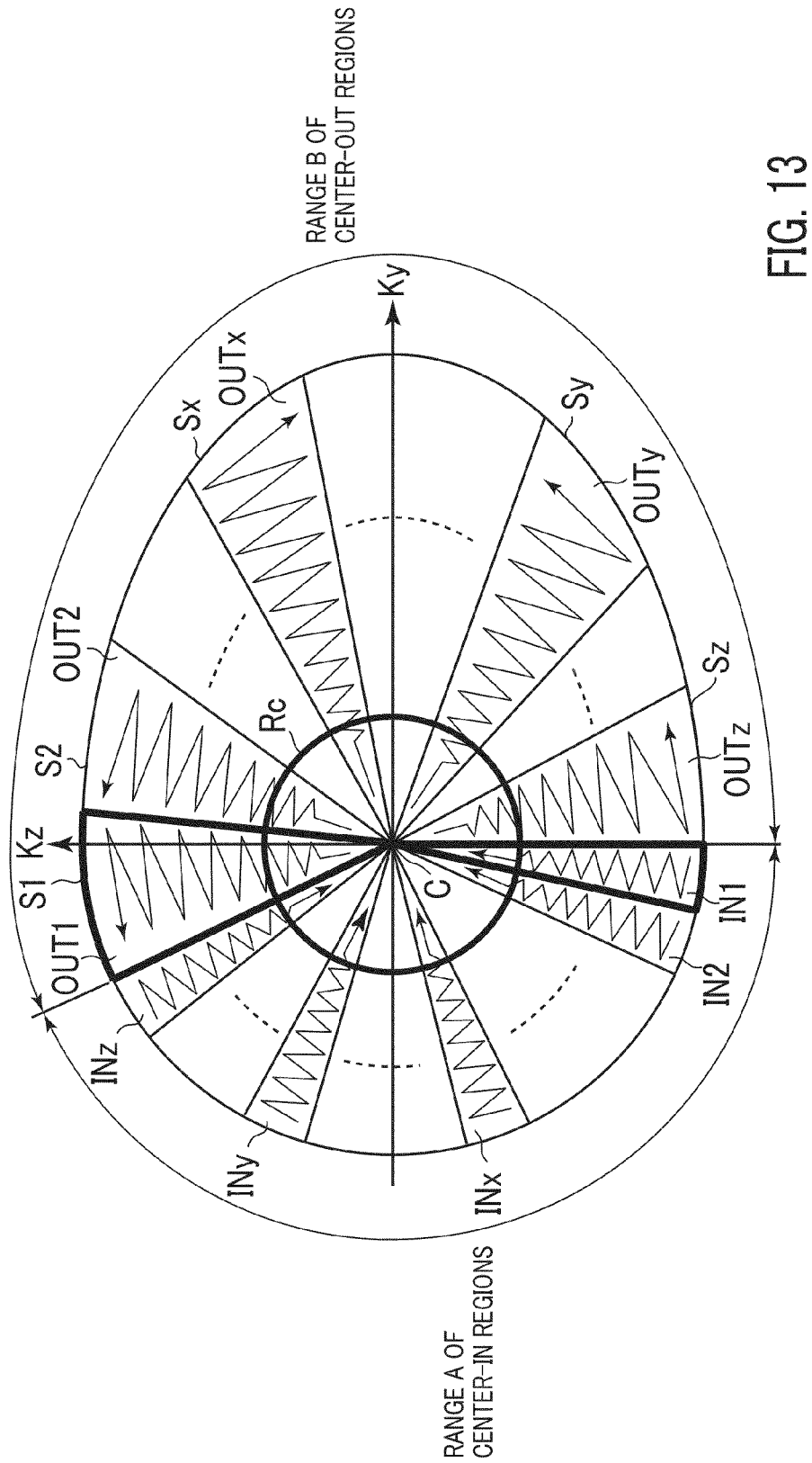
FIG. 13 is a diagram illustrating a center region most related to the contrast of an image in a ky-kz plane.
Figure 14B:
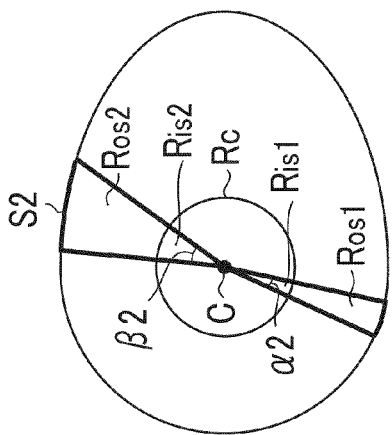
FIGS. 14A through 14E are diagrams individually depicting five segments S1, S2, Sx, Sy and Sz in FIG. 13.
Figure 14A:
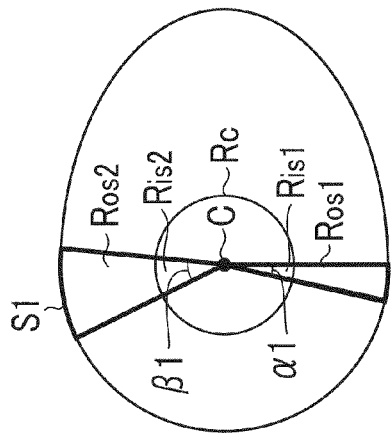
Figure 14E:
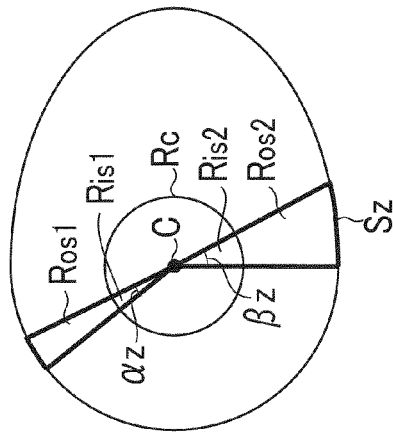
Figure 14D:
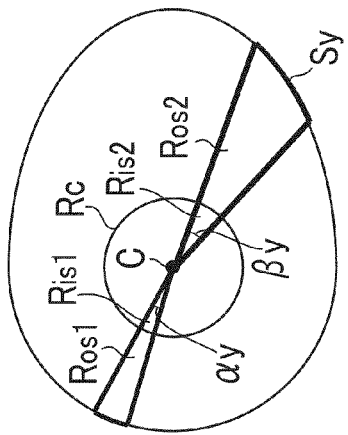
Figure 14C:
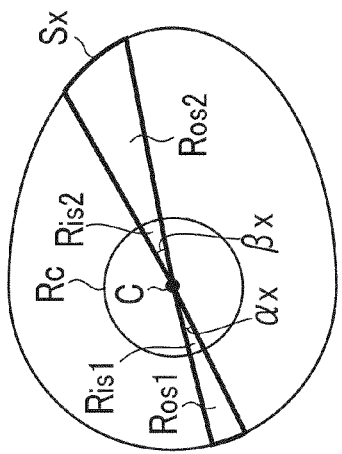

FIG. 13 is a diagram showing a center region most related to the contrast of an image in a ky-kz plane, and FIGS. 14A-14E are individually showing five segments S1, S2, Sx, Sy and Sz in FIG. 13, respectively.

The region most related to the contrast of the image in the ky-kz plane is of a center region Rc which surrounds the center C of the ky-kz plane and its proximity. Since the segments S1 through Sz cut across the center region Rc, they are respectively divided into inside regions Ris 1 and Ris2 placed inside the center region Rc and outside regions Ros1 and Ros2 placed outside the center region Rc as shown in FIGS. 14A-14E (incidentally, although only the inside regions Ris1 and Ris2 and the outside regions Ros1 and Ros2 of the segments S1, S2, Sx, Sy and Sz are shown in FIGS. 14A-14E, other segments are also divided into he inside regions Ris1 and Ris2 and the outside regions Ros1 and Ros2). Thus, although the outside regions Rout1 and Rout2 of the segments S1 through Sz are not so related to the image's contrast, the inside regions Ris1 and Ris2 of the segments S1 through Sz become regions most related to the image's contrast. In order to obtain, for example, a high-contrast image in which the muscle 12e has been inhibited and the arterial blood 12c has been emphasized, it is desirable to locate data in the inside regions Ris1 and Ris2 of the segments S1 through Sz while the value of a difference ΔMz (refer to FIG. 4) in longitudinal magnetization between the muscle 12e and the arterial blood 12c is large.

In the present embodiment, a description will be made below of to which value the longitudinal magnetization of the muscle 12e and the arterial blood 12c correspond when the data are located in the inside regions Ris1 and Ris2 of the segments S1 through Sz, with reference to FIG. 15. Incidentally, although the longitudinal magnetization of the muscle 12e and the arterial blood 12c at the time that the data are located in the inside regions Ris1 and Ris2 of the segment S1 will be described below, other segments S2 through Sz can also be explained in a manner similar to the segment S1.

Figure 15:
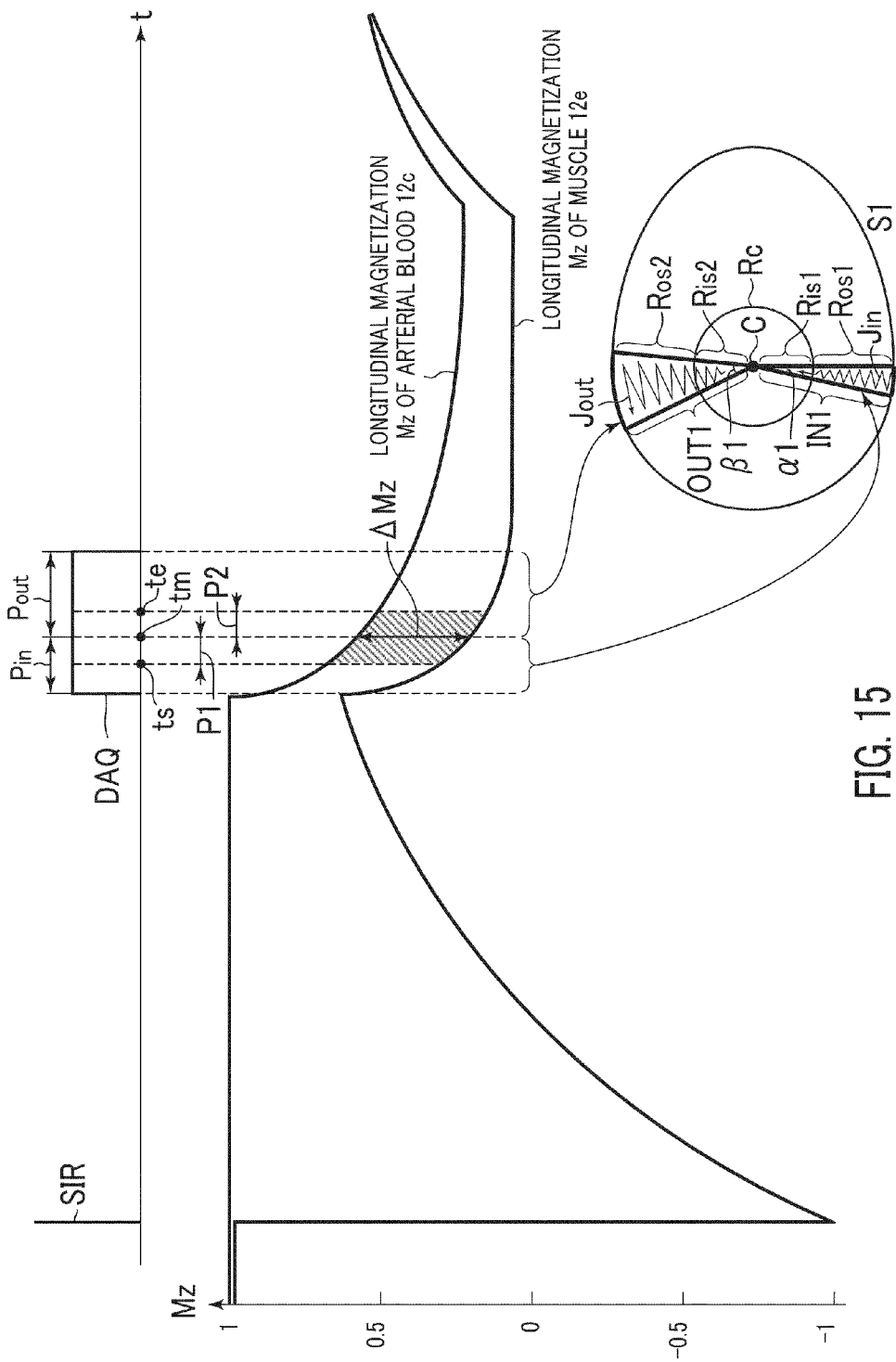
FIG. 15 is a diagram for explaining a relationship between longitudinal magnetization Mz of arterial blood $12c$ and a muscle $12e$ when data are located in inside regions Ris1 and Ris2 of the segment S1.

FIG. 15 is a diagram for describing a relationship between the longitudinal magnetization Mz of the arterial blood 12 and that of the muscle 12e when the data are located in the inside regions Ris1 and Ris2 of the segment S1. Three-dimensional data, for example, for a plurality of coronal images, are acquired by performing a pulse sequence. The three-dimensional data are associated with three-dimensional k-space (Kx, Ky, Kz). First, one-dimensional Kx data in the first point of (Ky, Kz) are acquired. Next, the second point of (Ky, Kz) which is different from the first point is determined, and one-dimensional Kx data in the second point of (Ky, Kz) are acquired. A trajectory of points of (Ky, Kz) is zigzags from an exterior of the (Ky, Kz) plane through its center to another exterior of the (Ky, Kz) plane, as shown in FIG. 8 etc.

As described with reference to FIGS. 11A-11C, the data are located in the center-in region IN1 of the segment S1 in accordance with the trajectory Jin during the center-in period Pin. The data are located in the center-out region OUT1 in accordance with the trajectory Jout during the center-out period Pout. Thus, the data is located in the inside region Ris1 during a period P1 from a time is lying midway through the center-in period Pin to an end time of the center-in period Pin. The data is located in the inside region Ris2 during a period P2 from a start time tm of the center-out period Pout to a time to lying midway through the center-out period Pout. During the periods P1 and P2 in which the data are respectively located in the inside regions Ris1 and Ris2, the value of ΔMz ranges from about 0.3 to about 0.4.

Although FIG. 15 has explained the case where the data are located in the segment S1, data are located in the inside regions Ris1 and Ris2 while ΔMz has a value ranging from ΔMz=about 0.3 to about 0.4, even at other segments S2 through Sz in a manner similar to the segment S1.

Generally, if the value of ΔMz ranges from about 0.3 to about 0.4, then an MR image can obtain sufficient contrast between the arterial blood 12c and the muscle 12e. Although only the difference ΔMz in longitudinal magnetization between the arterial blood 12c and the muscle 12e is shown in FIG. 15, data are located in the inside regions Ris1 and Ris2 while, for example, a difference ΔMz' in longitudinal magnetization between the arterial blood 12c and the venous blood 12d also has a value ranging from ΔMz'=about 0.3 to about 0.4. Thus, the location of the data in the segments S1 through Sz in accordance with the trajectories Jin and Jout makes is possible to inhibit the background tissues such as the muscle 12e, the venous blood 12d, etc. and obtain a high-contrast image in which the arterial blood 12c has been emphasized.

Incidentally, when the vertical angles α1 through αz of the center-in regions IN1 through INz are made larger, the area of the inside region Ris1 becomes larger, whereas when the vertical angles α1 through αz thereof are made smaller, the area thereof becomes smaller. Thus, the width of the period P1 during which the data is located in the inside region Ris1 can be adjusted by changing the values of the vertical angles α1 through αz of the center-in regions IN1 through INz. Similarly, the width of the period P2 during which the data is located in the inside region Ris2 by changing the values of the vertical angles β1 through βz of the center-out regions OUT1 through OUTz. Thus, the values of the vertical angles α1 through αz of the center-in regions IN1 through INz, and the values of the vertical angles β1 through βz of the center-out regions OUT1 through OUTz are changed, thereby making it possible to adjust the widths of the periods P1 and P2 such that required contrast can be obtained.

In the present embodiment, the respective segments S1 through Sz are defined in such a manner that the vertical angles of the center-out regions become values larger than the vertical angles of the center-in regions (refer to the expression (2)). Thus, the areas of the respective segments can be made larger as compared with the case of αj=βj. It is therefore possible to reduce the total number of segments defined in the data location region R and shorten the imaging time. Incidentally, although the vertical angles of the center-out regions have been defined so as to be the values larger than the vertical angles of the center-in regions with respect to all the segments S1 through Sz in the present embodiment, the vertical angles of the center-out regions may be defined so as to be values larger than the vertical angles of the center-in regions only with respect to some segments of the segments S1 through Sz.

Incidentally, the data location region R is divided into the z segments in the above description. A description will be made below of examples in which the data location region R is divided into z=32 segments, z=21 segments and z=16 segments.

Figure 16:
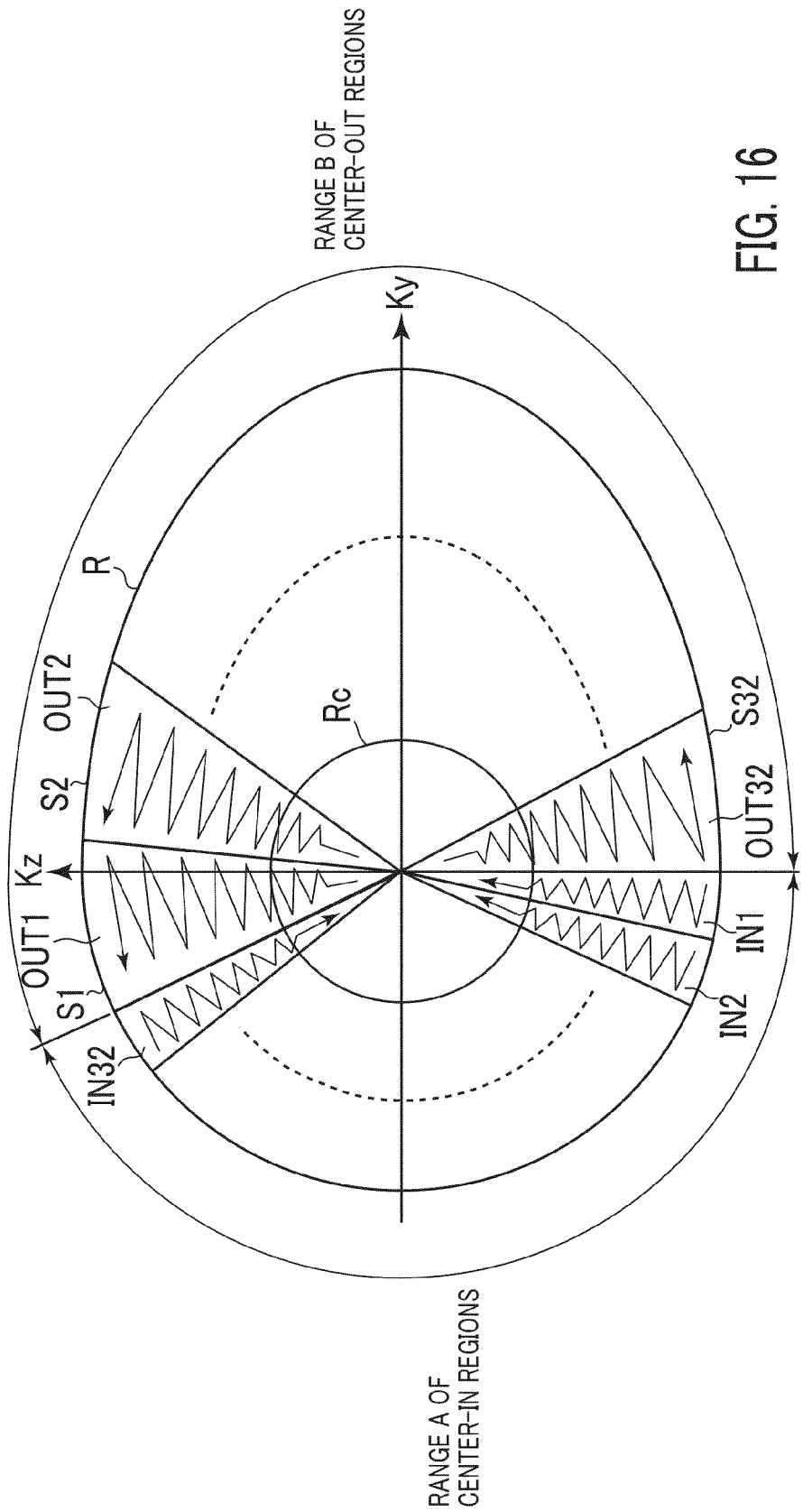
FIG. 16 is a diagram showing an example where the data location region R is divided into z=32 segments.
Figure 17:
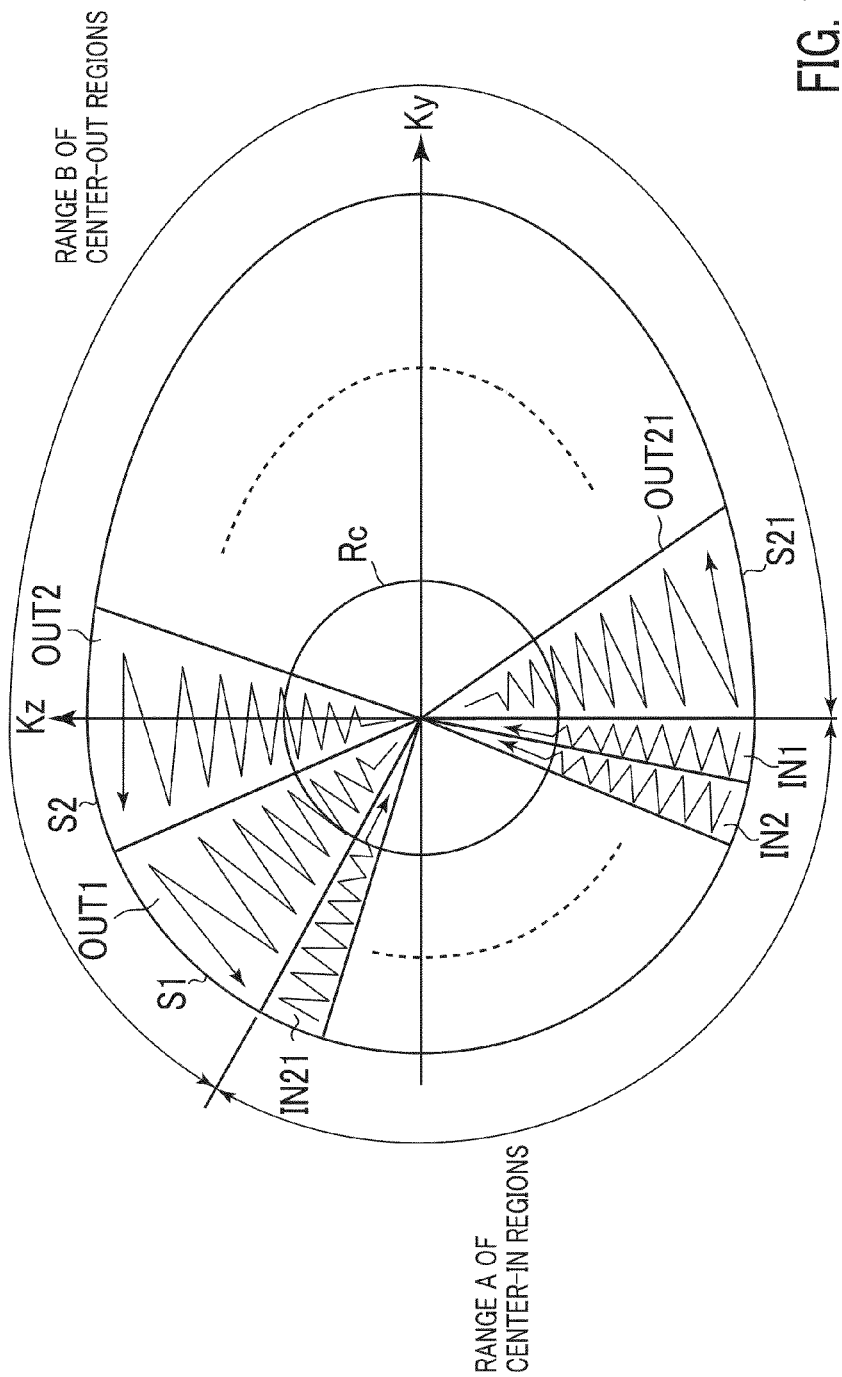
FIG. 17 is a diagram showing an example where the data location region R is divided into z=21 segments.
Figure 18:
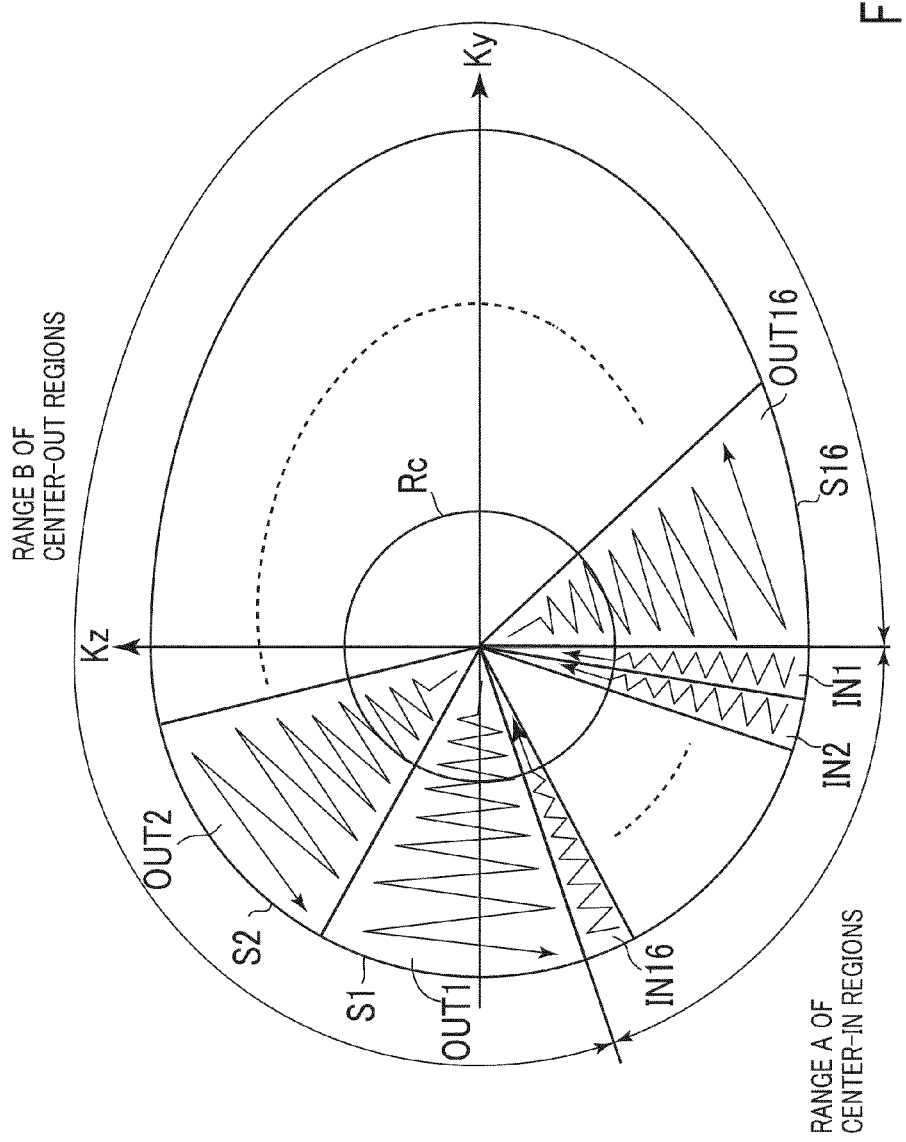
FIG. 18 is a diagram showing an example where the data location region R is divided into z=16 segments.

FIGS. 16 through 18 are respectively diagrams showing the examples in which the data location region R is divided into z=32 segments, z=21 segments and z=16 segments.

In FIGS. 16 through 18, the data location region R is divided in such a manner that as the total number of segments into which the data location region R is divided decreases, a range A of center-in regions becomes narrower (i.e., a range B of center-out regions becomes wider). Thus, when the data location region R is divided into z=16 segments, the range A of center-in regions becomes the narrowest.

A description will next be made of the lengths of data acquisition sequences DAQ where the data location region R is divided into z=32 segments, z=21 segments and z=16 segments.

Figure 19:
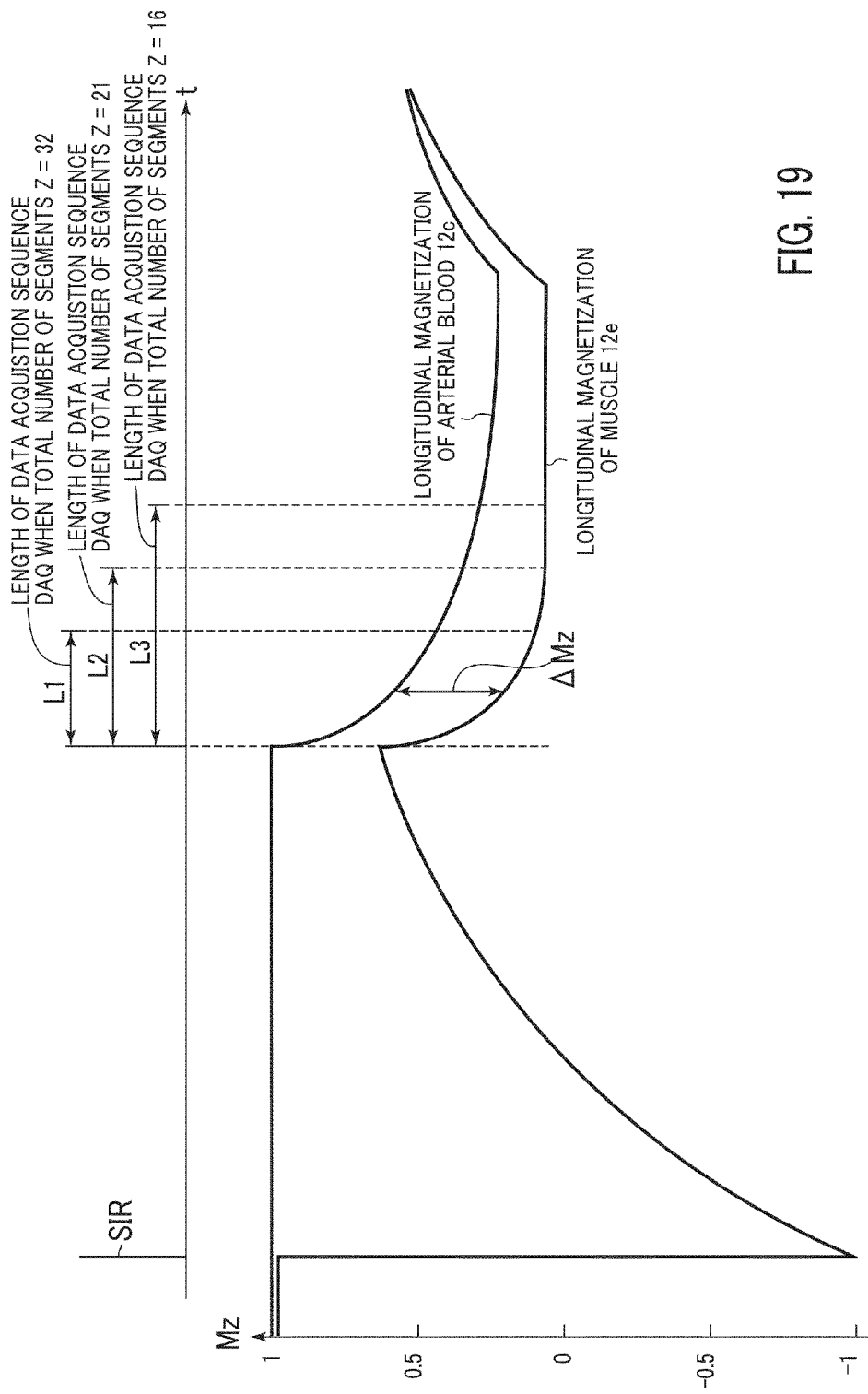
FIG. 19 is a diagram illustrating, by comparison, lengths of data acquisition sequences DAQ where the data location region R is divided into z=32 segments, z=21 segments and z=16 segments.

FIG. 19 is a diagram showing, by comparison, the lengths of the data acquisition sequences DAQ where the data location region R is divided into z=32 segments, z=21 segments and z=16 segments.

Since the area of one segment becomes wider as the total number of segments into which the data location region R is divided decreases, the time of each data acquisition sequence DAQ can be made longer. Thus, since the number of data points that can be acquired by one pulse sequence PS can be increased, the imaging time can be shortened. In FIG. 19, the data acquisition sequence DAQ becomes the longest length L3 where the total number of segments z is z=16. Accordingly, the imaging time can be most shortened where the total number of segments z is set to z=16.

Even though the length of the data acquisition sequence DAQ is set to any of L1, L2 and L3, data can be located in the center region R while the value of ΔMz lies between about 0.3 and about 0.4. Therefore, images nearly equal in contrast can be obtained regardless of the length of the data acquisition sequence DAQ. In order to verify this, the subject 12 was imaged or captured in accordance with the numbers of the segments shown in FIGS. 16 through 18. Results of its imaging will be explained below.

FIGS. 20A-20D are diagrams for explaining the results of imaging.

FIGS. 20A, 20B, and 20C show images obtained using the method of the present embodiment and their imaging conditions. FIG. 20D shows, as an example compared with the present embodiment, an image obtained where the subject 12 was imaged by orthogonal view ordering, and its imaging conditions.

The imaging conditions are (1) number of segments, (2) number of data points contained in one center-in region, (3) number of data points contained in one center-out region, (4) length of data acquisition sequence DAQ and (5) imaging time as viewed in order from above.

Referring to 20A, 20B, and 20C, the imaging time is represented as 2 minutes and 17 seconds, 1 minute and 30 seconds, and 1 minute and 9 seconds. It is understood that when a comparison is made between FIGS. 20A-20C and FIG. 20D, FIG. 20A is identical to FIG. 20D in imaging time but FIGS. 20B and 20C may be shorter than FIG. 20D in imaging time. It is understood that when a comparison is made between FIGS. 20A-20D, equal contrast can be obtained regardless of the imaging time. It is thus understood that high-contrast images can be obtained in less imaging time by using the method of the present embodiment.

Incidentally, the shapes of the segments that divide the data location region R may be shapes different from those shown in FIGS. 16 through 18. A modification descriptive of the shapes of segments will next be explained.

Figure 21:
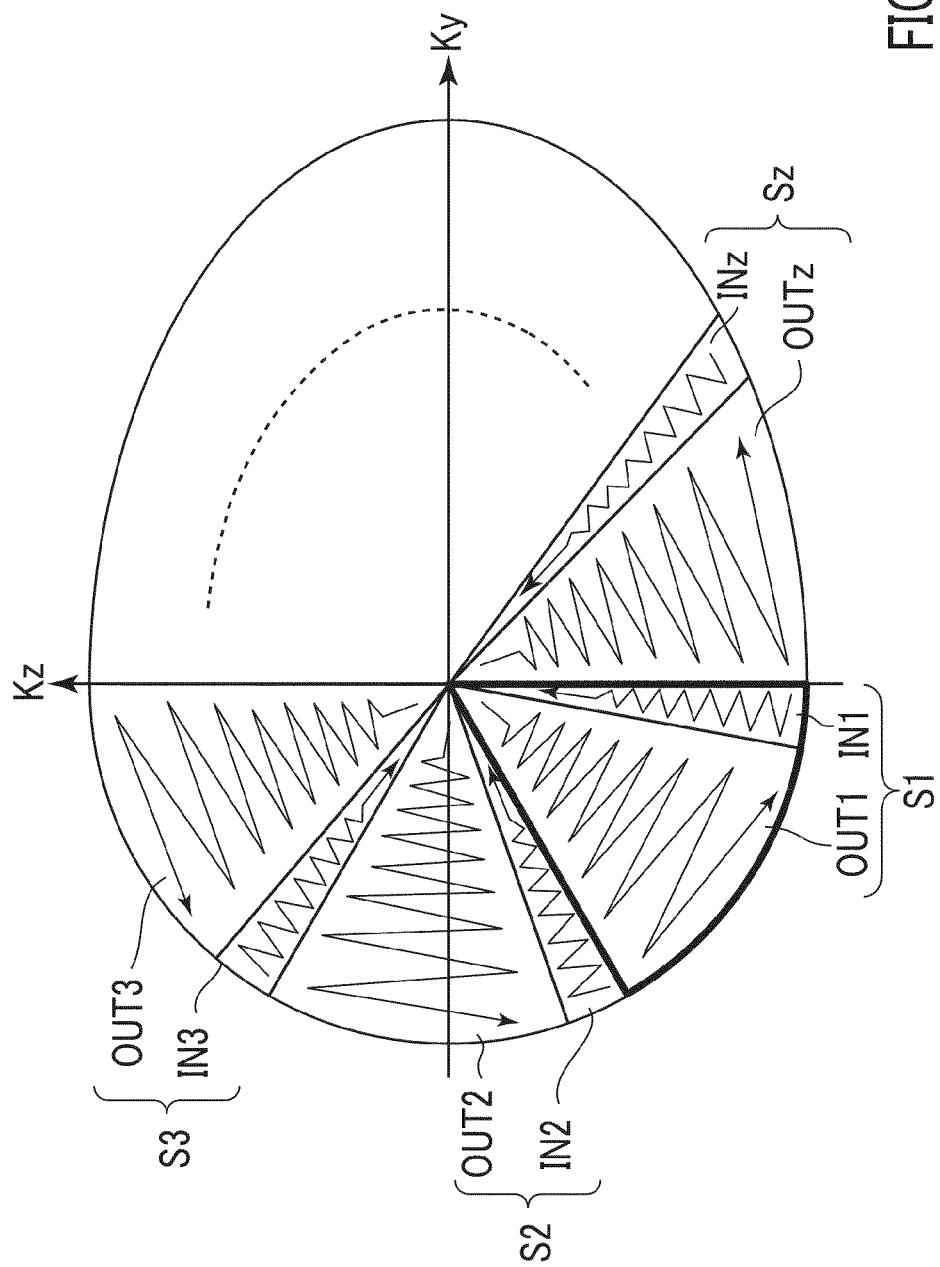
FIG. 21 is a diagram showing a modification descriptive of the shapes of segments.

FIG. 21 is a diagram showing a modification descriptive of the shapes of segments.

FIG. 21 shows a case where the shape of each of segments Sj (where j=integers of 1 to z) is approximately sectoral. The segments Sj respectively have center-in regions INj and center-out regions OUTj. The center-in regions INj and the center-out regions OUTj are set so as to adjoin each other. Thus, the center-in regions IN1 through INz and the center-out regions OUT1 through OUTz are respectively defined so as to be aligned alternately in FIG. 21. Even though the segments Sj are set as shown in FIG. 21, a high-contrast image can be obtained in less imaging time by determining the center-in regions INj and the center-out regions OUTj in such a manner that the expression (2) is established.

Although the example in which the data location region R approximately elliptical in shape is divided by the segments has been shown in the preceding description, the shape of the data location region R is not limited to the approximately elliptical shape, but can be set to an arbitrary shape.

Figure 22:
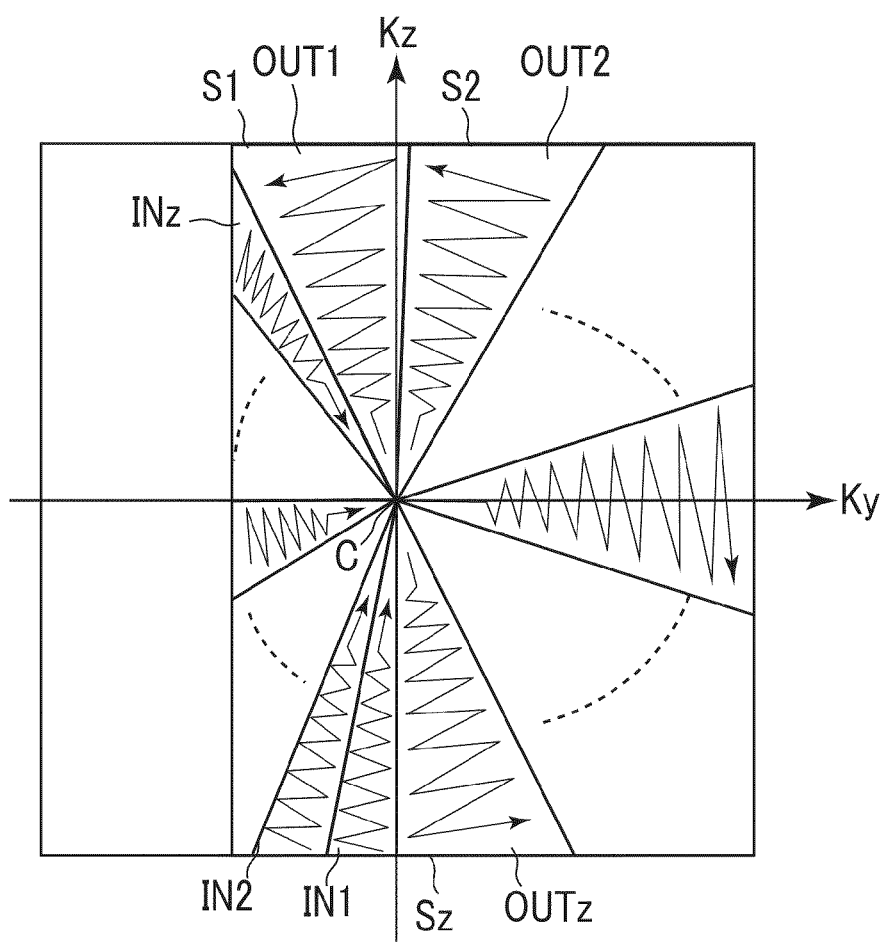
FIG. 22 is a diagram showing an example in which a rectangular data location region R is divided by segments.

FIG. 22 is a diagram showing an example in which a rectangular data location region R is divided by segments.

A high-contrast image can be obtained in less imaging time by determining center-in regions INj and center-out regions OUTj in such a manner that even though segments Sj are set as shown in FIG. 22, the expression (2) is established.

Incidentally, the present embodiment has described the case where the subject 12 is imaged by the respiratory gating method. The invention can however be applied even to a case where the subject 12 is imaged by a cardiac gating method, a case where the subject 12 is imaged by utilizing the respiratory gating method and the cardiac gating method in combination, and a case where the subject 12 is imaged without using the gating methods.

Many widely different embodiments of the invention may be configured without departing from the spirit and the scope of the present invention. It should be understood that the present invention is not limited to the specific embodiments described in the specification, except as defined in the appended claims.

What is claimed is:

1. A magnetic resonance imaging apparatus comprising:
   a central processing unit configured to transmit information about a pulse sequence to emphasize arterial blood relative to at least one of venous blood and a muscle, wherein the pulse sequence divides a ky-kz plane into a plurality of segments, the plurality of segments including data located therein,
   wherein the pulse sequence includes a selective inversion pulse (SIR) and a data acquisition sequence (DAQ)) after a predetermined inversion time of the SIR, the inversion time set to a time for a longitudinal magnetization of the venous blood to reach a null point,
   wherein the ky-kz plane is divided into a plurality of center-in regions and a plurality of center-out regions by a plurality of lines extending radially from a center of the ky-kz plane,
   wherein the plurality of center-in regions have data located therein in accordance with respective first trajectories that proceed toward the center of the ky-kz plane, wherein the plurality of center-out regions have data located therein in accordance with respective second trajectories that proceed away from the center of the ky-kz plane, wherein each of the plurality of segments includes one of the plurality of center-in regions and a corresponding one of the plurality of center-out regions, wherein each of the plurality of segments is defined such that after data have been located in the center-in region in accordance with the first trajectory, data are located in the center-out region in accordance with the second trajectory, wherein at least one of the plurality of segments is defined such that an angle of the center-in region at the center of the ky-kz plane is wider than an angle of the center-out region at the center of the ky-kz plane, and wherein a difference between a longitudinal magnetization value of the arterial blood and a longitudinal magnetization value of the muscle is at least 0.3 at the center of the ky-kz plane.

2. The magnetic resonance imaging apparatus according to claim 1, wherein each of the plurality of segments is defined such that the angle of the center-in region at the center of the ky-kz plane is wider than the angle of the center-out region at the center of the ky-kz plane.

3. The magnetic resonance imaging apparatus according to claim 1, wherein the ky-kz plane defines a data location region with data located therein, and wherein the data location region is divided into the plurality of segments.

4. The magnetic resonance imaging apparatus according to claim 2, wherein the ky-kz plane defines a data location region with data located therein, and wherein the data location region is divided into the plurality of segments.

5. The magnetic resonance imaging apparatus according to claim 1, wherein the ky-kz plane is divided into first and second regions, wherein the plurality of center-in regions are provided in the first region, and wherein the plurality of center-out regions are provided in the second region.

6. The magnetic resonance imaging apparatus according to claim 2, wherein the ky-kz plane is divided into first and second regions, wherein the plurality of center-in regions are provided in the first region, and wherein the plurality of center-out regions are provided in the second region.

7. The magnetic resonance imaging apparatus according to claim 3, wherein the ky-kz plane is divided into first and second regions, wherein the plurality of center-in regions are provided in the first region, and wherein the plurality of center-out regions are provided in the second region.

8. The magnetic resonance imaging apparatus according to claim 1, wherein the plurality of center-in regions are alternately aligned with the plurality of center-out regions.

9. The magnetic resonance imaging apparatus according to claim 2, wherein the plurality of center-in regions are alternately aligned with the plurality of center-out regions.

10. The magnetic resonance imaging apparatus according to claim 3, wherein the plurality of center-in regions are alternately aligned with the plurality of center-out regions.

11. The magnetic resonance imaging apparatus according to claim 1, wherein data are respectively located in the plurality of segments by a respiratory gating method.

12. The magnetic resonance imaging apparatus according to claim 2, wherein data are respectively located in the plurality of segments by a respiratory gating method.

13. The magnetic resonance imaging apparatus according to claim 3, wherein data are respectively located in the plurality of segments by a respiratory gating method.

14. The magnetic resonance imaging apparatus according to claim 5, wherein data are respectively located in the plurality of segments by a respiratory gating method.

15. The magnetic resonance imaging apparatus according to claim 8, wherein data are respectively located in the plurality of segments by a respiratory gating method.

16. The magnetic resonance imaging apparatus according to claim 1, wherein data are respectively located in the plurality of segments by a cardiac gating method.

17. The magnetic resonance imaging apparatus according to claim 2, wherein data are respectively located in the plurality of segments by a cardiac gating method.

18. The magnetic resonance imaging apparatus according to claim 5, wherein data are respectively located in the plurality of segments by a cardiac gating method.

19. The magnetic resonance imaging apparatus according to claim 8, wherein data are respectively located in the plurality of segments by a cardiac gating method.

20. A method for magnetic resonance imaging comprising:

dividing, as part of a pulse sequence, a ky-kz plane into a plurality of segments that each include data located therein, wherein the pulse sequence divides the ky-kz plane into the plurality of segments such that the pulse sequence emphasizes arterial blood relative to at least one of venous blood and a muscle, wherein the pulse sequence includes a selective inversion pulse (SIR) and a data acquisition sequence (DAQ) after a predetermined inversion time of the SIR, the inversion time set to a time for a longitudinal magnetization of the venous blood to reach a null point;

dividing the ky-kz plane into a plurality of center-in regions and a plurality of center-out regions by a plurality of lines extending radially from a center of the ky-kz plane, wherein the plurality of center-in regions have data located therein in accordance with respective first trajectories which proceed toward the center of the ky-kz plane, wherein the plurality of center-out regions have data located therein in accordance with respective second trajectories which proceed away from the center of the ky-kz plane, and wherein each of the plurality of segments includes one of the plurality of center-in regions and a corresponding one of the plurality of center-out regions;

defining each of the plurality of segments such that after data have been located in the center-in region in accordance with the first trajectory, data are located in the center-out region in accordance with the second trajectory; and defining at least one of the plurality of segments such that an angle of the center-in region at the center of the ky-kz plane is wider than an angle of the center-out region at the center of the ky-kz plane, wherein a difference between a longitudinal magnetization value of the arterial blood and a longitudinal magnetization value of the muscle is at least 0.3 at the center of the ky-kz plane.

* * * * *